United States Patent [19]

Lee et al.

[11] Patent Number: 5,448,068
[45] Date of Patent: Sep. 5, 1995

[54] PYROELECTRIC THIN FILM INFRARED SENSOR AND METHOD FOR FABRICATING THE SAME

[75] Inventors: Don-Hee Lee; Sung M. Cho, both of Kyungki; Sung T. Kim, Seoul, all of Rep. of Korea

[73] Assignee: Goldstar Co., Ltd., Rep. of Korea

[21] Appl. No.: 262,859

[22] Filed: Jun. 21, 1994

[30] Foreign Application Priority Data

Jun. 22, 1993 [KR] Rep. of Korea ............ 11409/1993

[51] Int. Cl.⁶ .................................. G01J 5/02
[52] U.S. Cl. .................................. 250/338.3
[58] Field of Search ........................ 250/338.3

[56] References Cited

FOREIGN PATENT DOCUMENTS

| 38427 | 2/1986 | Japan | 250/338.3 |
| 211520 | 9/1987 | Japan | 250/338.3 |
| 124923 | 5/1988 | Japan | 250/338.3 |
| 124924 | 5/1988 | Japan | 250/338.3 |

OTHER PUBLICATIONS

Takayama et al., "Pyroelectric Infrared Array Sensors Made of c-Axis-Oriented La-modified PbTiO₃ Thin Films", *Sensors and Actuators*, A21-23 (1990) pp. 508-512.

*Primary Examiner*—Carolyn E. Fields
*Attorney, Agent, or Firm*—Ostrolenk, Faber, Gerb & Soffen

[57] ABSTRACT

A pyroelectric thin film infrared sensor including a lower Pt electrode disposed on the upper surface of a substrate, a pyroelectric thin film disposed on the upper surface of lower Pt electrode such that its right portion overlaps with a predetermined region of lower Pt electrode, and an upper Cr electrode disposed over the pyroelectric thin film, The lower Pt electrode has a thickness of 150 to 400 Å while the substrate is comprised of an MgO single crystal substrate having (100)-oriented plane, so as to increase the C-axis orientation of the pyroelectric thin film. With such a structure, the pyroelectric thin film exhibits an improvement in infrared ray sensitivity.

13 Claims, 5 Drawing Sheets

PYROELECTRIC THIN FILM INFRARED SENSOR AND METHOD FOR FABRICATING THE SAME

BACKGROUND OF THE INVENTION

1. Field of the Invention

The present invention relates to a pyroelectric thin film infrared sensor and a method for fabricating the same.

2. Description of the Prior Art

Pyroelectric thin film infrared sensors are generally used for realizing more convenient sensing systems because of their advantages of high sensitivity at long wavelength and operability at room temperature without use of any cooling system.

Referring to FIG. 1, there is illustrated an example of a conventional pyroelectric thin film infrared sensor. As shown in FIG. 1, the pyroelectric thin film infrared sensor includes a substrate 1 and a pyroelectric thin film 2 centrally disposed on the upper surface of substrate 1. Over the pyroelectric thin film 2, an Ni—Cr electrode 3 is disposed. A polyimide layer 5 is disposed over the entire exposed upper surface of the resulting structure including the exposed upper surface of the Ni—Cr electrode 3 and the exposed upper surface of the substrate 1. The polyimide layer 5 has a contact hole 4 through which the Ni—Cr electrode 3 is partially exposed at its upper surface. Over one side portion (the right portion in FIG. 1) of the upper surface of polyimide layer 5, a read-out electrode 6 made of an aluminum layer is disposed. The read-out electrode 6 is electrically connected to the Ni—Cr electrode 3 through the contact hole 4. Another polyimide layer 7 is disposed over the read-out electrode 6 except for the right end of the read-out electrode 6. The pyroelectric thin film infrared sensor further includes another Ni—Cr electrode 9 disposed beneath the substrate 1. The Ni—Cr electrode 9 is electrically connected to the lower surface of pyroelectric thin film 2 exposed through a hole 8 formed in the substrate 1 by use of an etching process. The Ni—Cr electrode 9 is disposed on the right portion of the surface of hole 8 and the right portion of the lower surface portion of substrate 1 not etched upon forming the hole 8.

Now, a method for fabricating the conventional pyroelectric thin film infrared sensor with the above-mentioned structure will be described, in conjunction with FIGS. 2A to 2E.

In accordance with this method, first, a substrate having (100)-oriented plane is prepared as the substrate 1, as shown in FIG. 2A. The substrate 1 may be an MgO single crystal substrate.

Over the substrate 1, a PbTiO$_3$-based pyroelectric thin film is deposited to a thickness of 3 μm using a radio frequency (RF)-magnetron sputtering process. The pyroelectric thin film has a perovskite structure and C-axis orientation. Thereafter, the pyroelectric thin film is subjected to a well-known photolithography process so that it remains only at its central portion. The remaining central portion of pyroelectric thin film constitutes the pyroelectric thin film 2 centrally disposed over the substrate 1.

Subsequently, a Ni—Cr thin film is deposited to a thickness of 0.4 μm over the resulting structure including the pyroelectric thin film 2 and the substrate 1 by use of a vacuum evaporation process, as shown in FIG. 2B. The Ni—Cr thin film is then selectively etched using the well-known photoetch process so that it is etched except for its portion disposed over the pyroelectric thin film 2, thereby forming the Ni—Cr electrode 3.

Over the entire exposed upper surface of the resulting structure, a polyimide layer is then deposited as the polyimide layer 5. This polyimide layer 5 is selectively etched using the well-known photoetch process so as to form a contact hole in the polyimide layer 5. The contact hole constitute the contact hole 4 for centrally exposing the upper surface of Ni—Cr electrode 3 therethrough.

As shown in FIG. 2C, an aluminum layer is then deposited over the entire exposed upper surface of the resulting structure including the upper surface of Ni—Cr electrode 3 and the exposed upper surface portion of substrate 1 by use of a sputtering process or an evaporation process. Subsequently, the aluminum layer is selectively etched using the well-known photoetch process so that it remains at its portion disposed over one side portion, namely, the right portion of the polyimide layer 5. The remaining portion of aluminum layer constitutes the read-out electrode 6.

Thereafter, formation of the polyimide layer 7 is carried out using the well-known photolithography process. The polyimide layer 7 is disposed over the read-out electrode 6 except for one side end, namely, the right end of the read-out electrode 6. The polyimide layer 7 is also disposed over a portion of the polyimide layer 5 adjacent to the left end of the read-out electrode 6.

As shown in FIG. 2D, the substrate 1 is subjected to a well-known anisotropic etch process at its portion disposed beneath the pyroelectric thin film 2, thereby forming the hole 8. In this case, the substrate 1 is anisotropically etched by use of an H$_3$PO$_4$ solution until the lower surface of pyroelectric thin film 2 is completely exposed. After completion of the etching, the pyroelectric thin film 2 is supported in position only by the polyimide layer 5.

A Ni—Cr layer for absorption of infrared rays is then deposited over the entire exposed lower surface of the resulting structure including the side wall surface of hole 8, the lower surface portion of substrate 1 not etched, and the exposed lower surface of pyroelectric thin film 2, by use of the sputtering process or the evaporation process, as shown in FIG. 2E. Subsequently, the Ni—Cr layer is then selectively etched using the well-known photoetch process so that it remains only at the right side wall surface portion of hole 8 and the right portion of the lower surface portion of substrate 1. The remaining portion of the Ni—Cr layer constitutes the Ni—Cr electrode 9.

Finally, a subsequent packaging step is carried out. At the packaging step, the Ni—Cr electrode 9 is bonded lo a corresponding one of leads of a lead frame not shown by a conductive paste. The exposed portion of lead-out electrode 6 is wire-boned to a gate of a junction field effect transistor (JFET) not shown by an Au wire.

In accordance with the above-mentioned conventional method, however, the lower surface of pyroelectric thin film 2 may be damaged by the etching solution upon anisotropically etching the lower surface of MgO single crystal substrate 1.

Furthermore, the conventional thin film infrared sensor also has a problem that the packaging step becomes complex because the Ni—Cr electrode for absorption of infrared rays can not be wire-bonded to the lead of lead frame. This is because the Ni—Cr electrode is disposed on the lower surface of substrate.

SUMMARY OF THE INVENTION

Therefore, an object of the invention is to provide a pyroelectric thin film infrared sensor capable of achieving an improvement in sensitivity for infrared rays by depositing a lower Pt electrode on a substrate to a predetermined thickness and then depositing a pyroelectric thin film over the lower Pt electrode, thereby increasing C-axis orientation of the pyroelectric thin film, and a method for fabricating the same.

In accordance with one aspect, the present invention provides a pyroelectric thin film infrared sensor comprising: a substrate; a lower electrode disposed on a predetermined region of an upper surface of the substrate; a pyroelectric thin film disposed on a predetermined region of an upper surface of the lower electrode; and an upper electrode disposed on a predetermined region of an upper surface of the pyroelectric thin film and adapted to absorb infrared rays.

In accordance with another aspect, the present invention a method for fabricating a pyroelectric thin film infrared sensor, comprising the steps of: forming a lower electrode on a predetermined region of an upper surface of a substrate; forming a pyroelectric thin film on a predetermined region of an upper surface of the lower electrode; and forming an upper electrode for absorption of infrared rays on a predetermined region of an upper surface of the pyroelectric thin film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
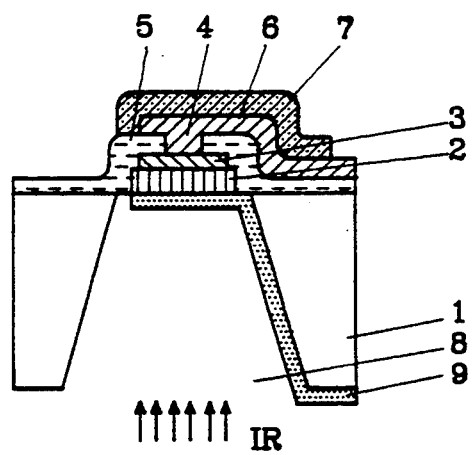
FIG. 1 is a sectional view illustrating a conventional pyroelectric thin film infrared sensor.
Figure 3:
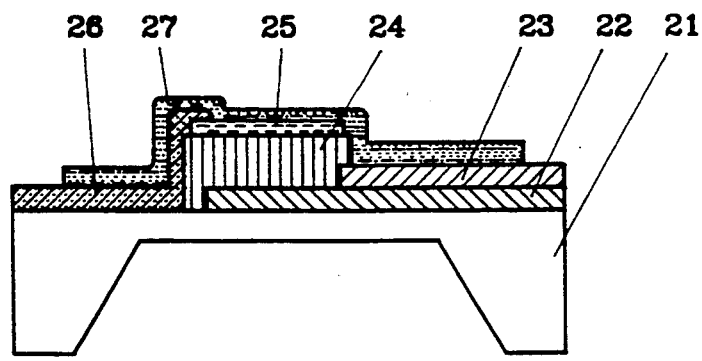
FIG. 3 is a sectional view illustrating a pyroelectric thin film infrared sensor in accordance with the present invention.
Figure 2A:
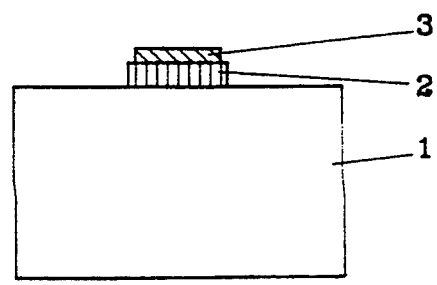
FIGS. 2A to 2E are sectional views respectively illustrating a method for fabricating the pyroelectric thin film infrared sensor shown in FIG. 1.
Figure 2B:
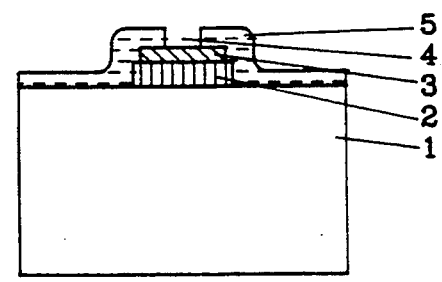
Figure 2C:
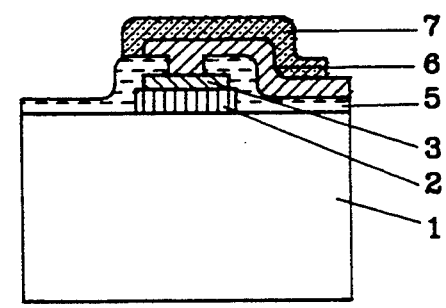
Figure 2D:
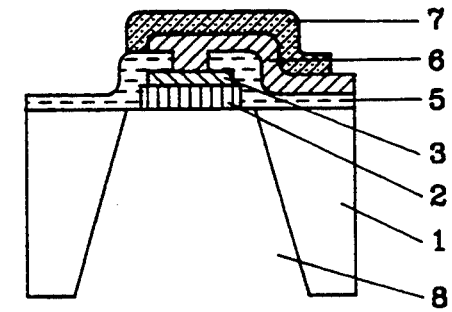
Figure 2E:
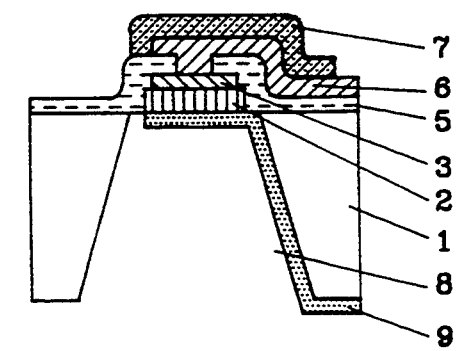

Referring to FIG. 3, there is illustrated a pyroelectric thin film infrared sensor in accordance with the present invention.

As shown in FIG. 3, the pyroelectric thin film infrared sensor of the present invention includes a substrate 21 having a membrane at its central portion of the lower surface thereof, and a lower Pt electrode 22 disposed on a portion of the upper surface of substrate 21, which portion extends from the right end of substrate 21 to a predetermined region of the membrane of substrate 21. A Pt pad 23 is disposed on a portion of the upper surface of lower Pt electrode 22, which portion extends from the right end of lower Pt electrode 22 to a predetermined region of the lower Pt electrode 22. A pyroelectric thin film 24 is disposed on the upper surface of lower Pt electrode 22 and the left end portion of Pt pad 23 such that its right portion overlaps with the predetermined region of lower Pt electrode 22. The pyroelectric thin film infrared sensor further includes an upper Cr electrode 25 disposed over the pyroelectric thin film 24, an aluminum pad 26 disposed on the left region of the upper surface of substrate 21 and the left portion of pyroelectric thin film 24 and electrically connected to the left end of upper Cr electrode 25, and a passivation layer 27 disposed on the Pt pad 23 and the aluminum pad 26 except for the right end portion of Pt pad 23 and the left end portion of aluminum pad 26.

A method for fabricating the pyroelectric thin film infrared sensor having the above-mentioned structure in accordance with the present invention will now be described, in conjunction with FIGS. 4A to 4E.

Figure 4A:
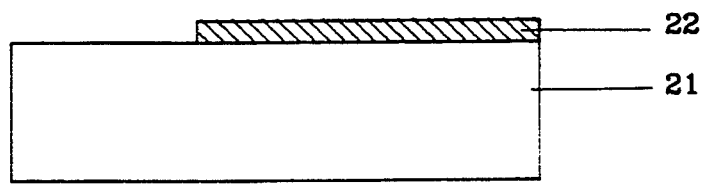
FIGS. 4A to 4E are sectional views respectively illustrating a method for fabricating the pyroelectric thin film infrared sensor shown in FIG. 3 in accordance with the present invention.

In accordance with this method, first, a substrate having (100)-oriented plane is prepared as the substrate 21, as shown in FIG. 4A. The substrate 21 may be an MgO single crystal substrate or a SrTiO$_3$ single crystal substrate.

Over the substrate 1, a Pt thin film is then deposited to a thickness of 150 to 400 Å using the sputtering technique. Subsequently, the Pt thin film is selectively etched using o the well-known photoetch process so that it remains only at a predetermined region of the upper surface of substrate 21. As a result, the remaining portion of Pt thin film forms the lower Pt electrode 22.

Although the Pt thin film is made of metal, it has a lattice constant well conforming to the lattice constant, particularly, the lattice constant of 3.89 Å on a-axis, of a pyroelectric thin film to be grown thereon because it has the thickness of 150 to 400 Å. Accordingly, where the Pt thin film is grown over the upper surface of the substrate 21 having (100)-oriented plane, the pyroelectric thin film can be subsequently grown over the Pt thin film to have C-axis orientation, namely, to have (001) plane. In this case, the substrate 21 having (100) plane, the Pt thin film and the pyroelectric thin film have lattice constants of 4.21 Å, 3.933 Å and 3.89 Å, respectively. As a result, the inconformity in lattice constant among the substrate 21, the Pt thin film and the pyroelectric thin film is within 10%.

Where the Pt thin film is deposited over the MgO single crystal substrate having the (100)-oriented plane to have (100)-oriented plane by use of the sputtering process under a condition shown in the following table 1, it exhibits a characteristic shown in FIG. 5 after an analysis using the X-ray diffraction.

TABLE 1

| Target | Pt |
|---|---|
| Gas Pressure | 0.1–1 Pa |
| Gas | Ar |
| Substrate Temperature | 580–610° C. |
| Power Density | 1–3 W/cm$^2$ |

Figure 5:
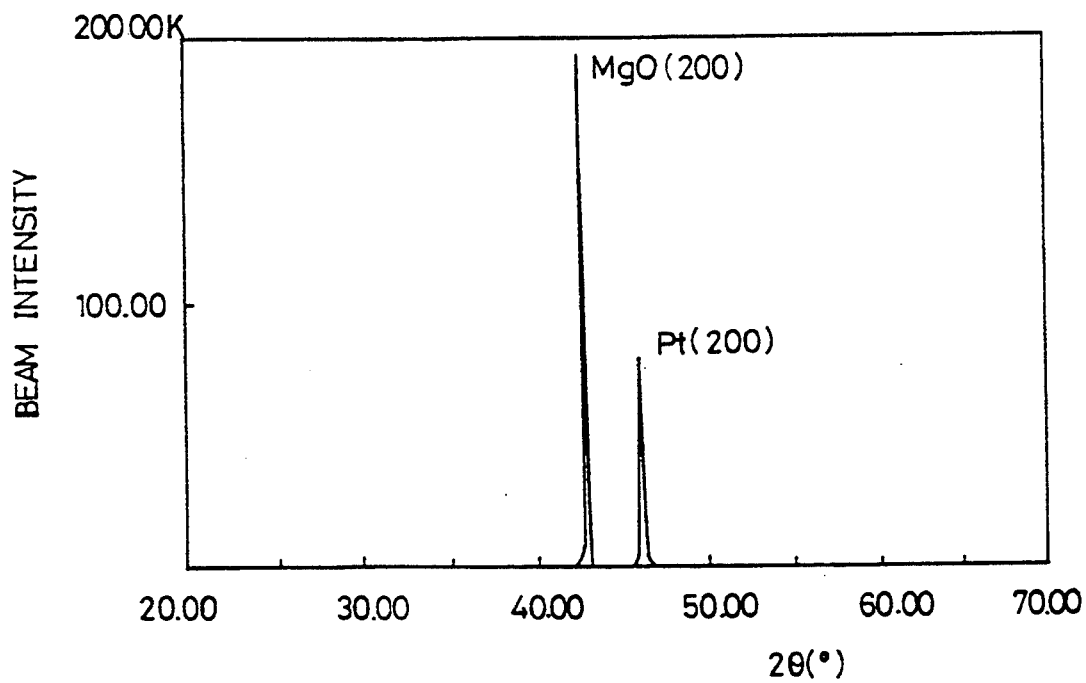
FIG. 5 is a graph illustrating orientation of a lower Pt electrode constituting a part of the pyroelectric thin film infrared sensor shown in FIG. 3 in accordance with an X-ray diffraction analysis.

By referring to FIG. 5, it can be found that the MgO single crystal substrate having the (200)-oriented plane and the Pt thin film having the (200)-oriented plane exhibits a remarkable beam intensity. It can be also found that the Pt thin film having the (200)-oriented plane is epitaxially grown to have (100)-oriented plane because the beam intensity of the Pt thin film was remarkably exhibited in the vicinity of 2 $\theta$ of 46°.

After observing the surface condition of the Pt thin film by use of the SEM device, it can be also found that a most desirable result is obtained when the Pt thin film is grown to the thickness of 150 to 400 Å. This will be described in more detail.

Where the Pt thin film has a thickness of less than 150 Å, it is possible to grow a pyroelectric thin film exhibiting a good C-axis orientation over the Pt thin film at a subsequent step. However, the Pt thin film has an undesirable structure similar to an island structure.

Upon performing the sputtering of the pyroelectric thin film at the subsequent step, the Pt thin film having the island structure may be subjected to a m-sputtering by grains sputtered from a target for the pyroelectric thin film, thereby causing the conductivity of Pt thin film to be degraded.

On the other hand, where the Pt thin film has a thickness of more than 400 Å, the bulk property of Pt thin film is increased during the growth of Pt thin film. As a result, fine hillock or stress may be generated at the Pt thin film.

As a consequence, the pyroelectric thin film deposited over the Pt thin film exhibits a great degradation in C-axis orientation when the thickness of Pt thin film is beyond the range from 100 Å to 400 Å.

Figure 6:
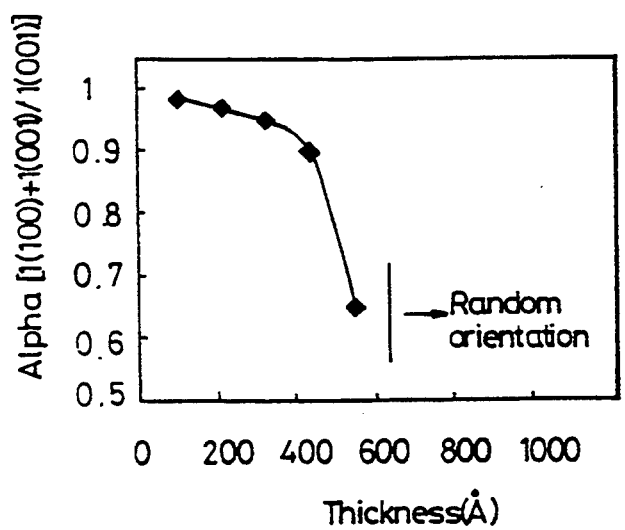
FIG. 6 is a graph illustrating a variation in C-axis orientation depending on a variation in thickness of the lower Pt electrode shown in FIG. 3.

In other words, as the thickness of Pt thin film increases from 100 Å to 400 Å, the pyroelectric thin film exhibits the C-axis orientation $\alpha$ from about 1 to about 0.9, as shown in FIG. 6. When the thickness of Pt thin film increases up to 500 Å, the C-axis orientation $\alpha$ of the pyroelectric thin film decreases to about 0.65. At the Pt thin film thickness of not less than 600 Å, the crystal growth orientation of the pyroelectric thin film becomes random.

Thus, the increase in Pt thin film thickness results in the decrease in C-axis orientation $\alpha$ of the pyroelectric thin film, thereby causing the sensitivity of the pyroelectric thin film infrared sensor to be degraded.

The C-axis orientation o can be expressed by the following equation (1):

$$\alpha = I(001)/[I(100) = I(001)] \quad (1)$$

where, I(100) stands for the X-ray diffraction intensity of (001)-oriented plane and I(100) stands for the X-ray diffraction intensity of (100)-oriented plane.

On the other hand, the sensitivity characteristic Fv of the pyroelectric thin film infrared sensor can be expressed by the following equation (2):

$$Fv = \gamma/Cv\epsilon_o\epsilon_r \quad (1)$$

where, $\gamma$ stands for the pyroelectric coefficient, Cv the volume specific heat of the pyroelectric thin film, $\epsilon_o$ the dielectric constant in vacuum, and $\epsilon_r$ the dielectric constant of the pyroelectric thin film.

By referring to the equation (1), it can be found that the sensitivity characteristic Fv of the pyroelectric thin film infrared sensor is improved at a higher pyroelectric coefficient $\gamma$ and a lower dielectric constant $\epsilon_r$ of the pyroelectric thin film.

Meanwhile, since the C-axis of the pyroelectric thin film is the poling axis, the pyroelectric thin film exhibits decreased dielectric constant $\epsilon_r$ in the direction of C-axis. Pyroelectric current is generated by a variation in polarization depending on a variation in temperature of the pyroelectric thin film. For obtaining an increased pyroelectric coefficient, it, therefore, is desirable to grow the pyroelectric thin film in the direction of the C-axis which is the poling axis.

Figure 4B:
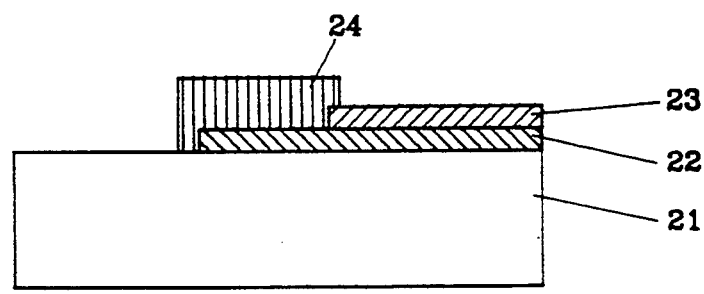

After the formation of the lower Pt electrode 22 shown in FIG. 4A, another Pt thin film is deposited to a thickness of 2,000 Å over the entire exposed upper surface of the resulting structure including the exposed upper surface of lower Pt electrode 22 and the exposed upper surface portion of substrate 21, by use of the well-known lift-off process and the sputtering technique, as shown in FIG. 4B. Thereafter, the Pt thin film is subjected to the well-known lift-off process so that it remains only at its portion disposed over a predetermined portion of the lower Pt electrode 22, thereby forming the Pt pad 23.

The Pt pad 23 is adapted to prevent the lower Pt electrode 22 having the small thickness of 150 to 400 Å from being damaged at subsequent wire-bonding step and at another subsequent step of sputtering a pyroelectric thin film.

In some cases, the step of forming the Pt pad 23 shown in FIG. 4B may be omitted.

Over the entire exposed upper surface of the resulting structure including the exposed upper surface portion of substrate 21, the exposed upper surface portion of lower Pt electrode 22 and the exposed tipper surface of Pt pad 23, a pyroelectric thin film made of a ferroelectric material is deposited using the RF-magnetron sputtering process. The deposition of pyroelectric thin film is carried out under a condition shown in the following table 2. In this case, the pyroelectric thin film has a composition of $Pb_{0.95}La_{0.05}TiO_3$.

TABLE 2

| Target | $Pb_{0.95}La_{0.05}TiO_3$ + 10 wt % PbO |
|---|---|
| Gas Pressure | 0.3–2 Pa |
| Gas | (Ar:O$_2$) 5:5–9:1 |
| Substrate Temperature | 580–610° C. |
| Power Density | 2–5 W/cm$^2$ |

The C-axis orientation $\alpha$ of the deposited pyroelectric thin film is decreased, depending an increase in thickness of the lower Pt electrode 22, as shown in FIG. 6. Since this has been described in detail hereinbefore, its further description will be omitted.

Subsequently, the pyroelectric thin film is selectively etched using the well-known photoetch process so that it remains at a predetermined portion of the upper surface of lower Pt electrode 22. The remaining portion of pyroelectric thin film forms the pyroelectric thin film 24.

This pyroelectric thin film 24 has right and left ends respectively disposed on the left end of Pt pad 23 and a portion of the upper surface of substrate 21 adjacent to the left end of lower Pt electrode 22.

Figure 7:
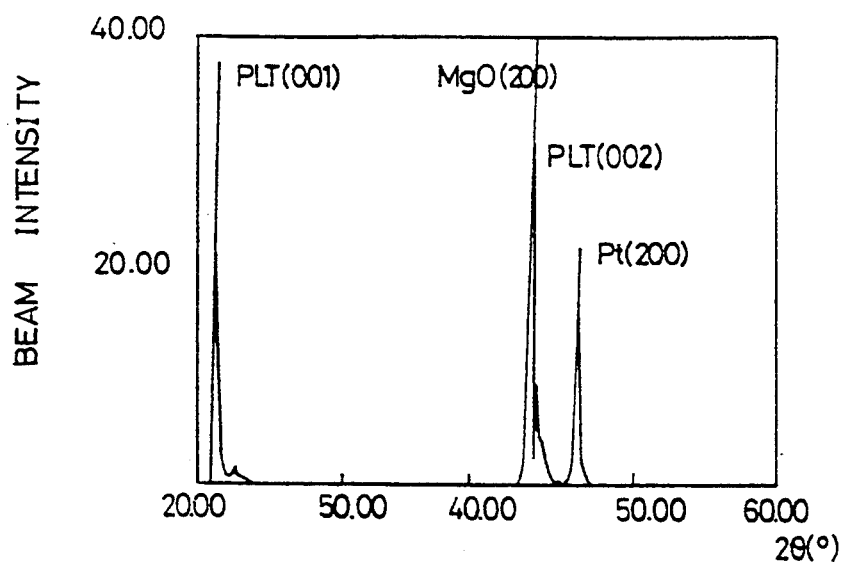
FIG. 7 is a graph illustrating orientation of a pyroelectric thin film constituting a part of the pyroelectric thin film infrared sensor shown in FIG. 3 in accordance with the X-ray diffraction analysis.

FIG. 7 is a graph depicting the X-ray diffraction analysis result of the pyroelectric thin film grown over the lower Pt electrode having a thickness of 300 Å to have the C-axis axis orientation α of not less than 0.9. FIG. 7 shows beam intensities of the pyroelectric thin film PLT observed at (001),(100) and (002)-oriented planes, the beam intensity of the MgO single crystal substrate observed at the (200)-oriented plane, and the beam intensity of the Pt thin film observed at the (200)-oriented plane.

Figure 4C:
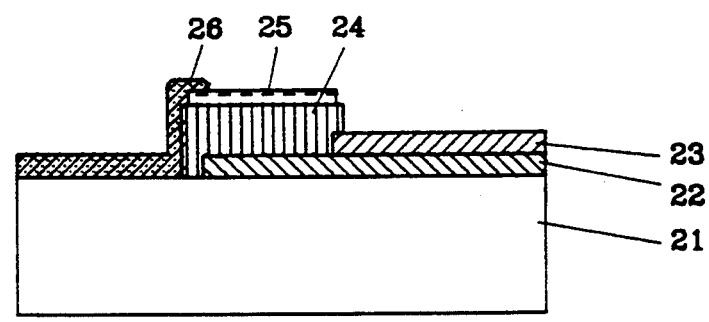

After the formation of the pyroelectric thin film 24, a Cr thin film exhibiting a high absorption of infrared rays is grown to a thickness of 300 to 400 Å over the entire exposed upper surface of the resulting structure including the exposed upper surface of pyroelectric thin film 24, the exposed upper surface portion of Pt pad 23 and the exposed upper surface portion of substrate 21, by use of the sputtering process or the evaporation process. The Cr thin film may be substituted by a Ni—Cr thin film. The Cr thin film is then selectively etched using the well-known photoetch process so that it remains only at its portion disposed over the pyroelectric thin film 24, as shown in FIG. 4C. The remaining portion of Cr thin film forms the upper Cr electrode 25.

Subsequently, an aluminum layer is then deposited over the entire exposed upper surface of the resulting structure including the upper surface of Cr electrode 25, the exposed upper surface of Pt pad 23 and the exposed upper surface portion of substrate 21 by use of the evaporation process. The aluminum layer is then selectively etched using the well-known photolithography process, thereby forming the aluminum pad 26 for the upper Cr electrode 25, as shown in FIG. 4C. The aluminum pad 26 is electrically connected to one side end portion of the upper Cr electrode 25. The aluminum pad 26 is also disposed over a predetermined region of the upper surface of substrate 21 and one-side end portion of the pyroelectric thin film 24.

Figure 4D:
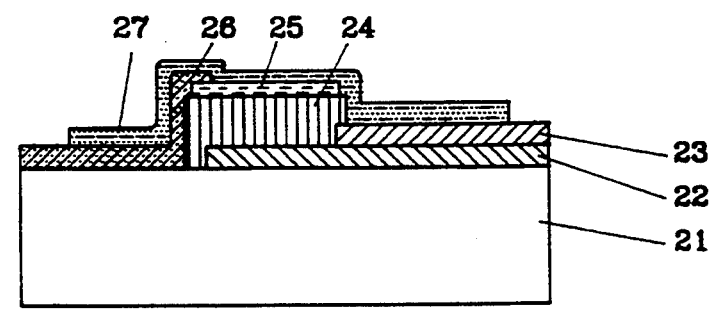

Using file well-known photolithography process, a polyimide layer 27 is formed over the resulting structure including the upper Cr electrode 25, the Pt pad 23, the aluminum pad 26 and the substrate 21, as shown in FIG. 4D. At this time, one side end portion of the Pt pad 23 and one side end portion of the aluminum pad 26 opposite to the one side end portion of the Pt pad 23 are exposed. The polyimide layer is made of a material exhibiting a high transmittance for infrared rays and a high elasticity.

Figure 4E:
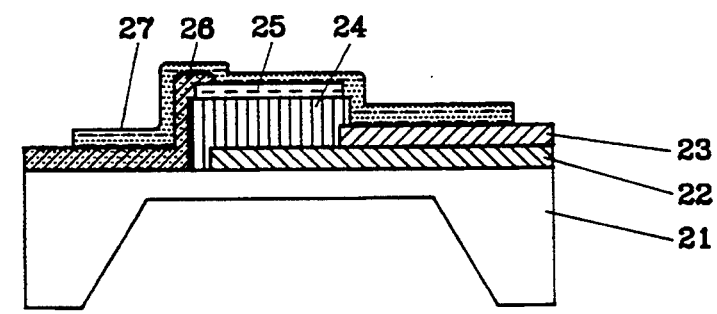

In order to prevent a thermal isolation of the pyroelectric thin film infrared sensor finally produced, that is, to prevent heat applied to the pyroelectric thin film 24 from being outwardly discharged through the substrate 21, the substrate 21 is then subjected at its lower surface to the well-known photoetch process for removing its portion disposed beneath the pyroelectric thin film 24, as shown in FIG. 4E. This will be described in more detail.

The lower surface of substrate 21 is anisotropically etched using an $H_3PO_4$ solution, thereby forming a membrane. In this case, the membrane has a thickness of not more than 20 μm. It is preferred that the thickness of membrane is as small as possible.

At a subsequent packaging step, the pyroelectric thin film infrared sensor fabricated as mentioned above is packed in a package body, together with a resistor having a high resistivity and a chip of a JFET.

After completion of the packaging step, a measurement of voltage response of the pyroelectric thin film infrared sensor is carried out. For the measurement, output voltage of the pyroelectric thin film infrared sensor is amplified to 60 dB. The result of the voltage response measurement will be described, in conjunction with FIGS. 8 and 9.

Figure 8:
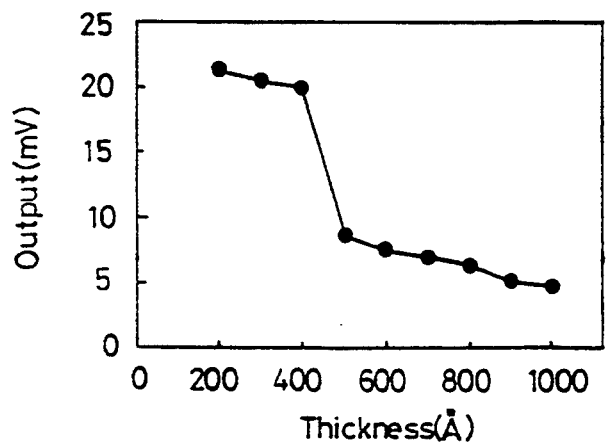
FIG. 8 is a graph illustrating a variation in output of the pyroelectric thin film infrared sensor depending on a variation in thickness of the lower Pt electrode shown in FIG. 3.

Referring to FIG. 8, it can be found that at the chopping frequency of 1 Hz, the voltage response is decreased from 22 μV to 51 μV, as the thickness of the low Pt electrode 22 is increased from 200 Å to 1,000 Å. It, therefore, can be understood that the pyroelectric thin film infrared sensor exhibits a higher voltage response at a smaller thickness of the lower Pt electrode 22, namely, at a higher C-axis orientation α of the pyroelectric thin film 24.

Figure 9:
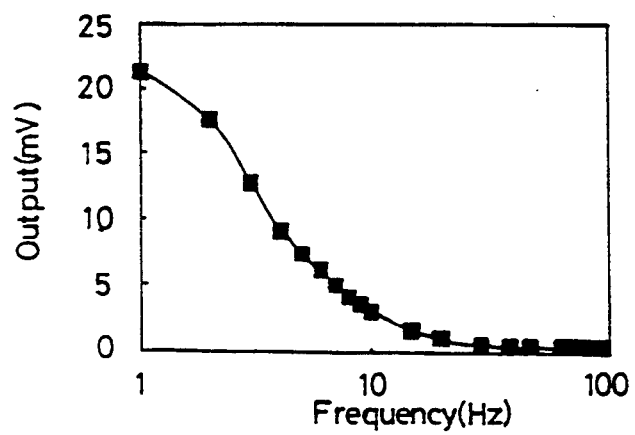
FIG. 9 is a graph illustrating a variation in output of the pyroelectric thin film infrared sensor shown in FIG. 3 depending on a variation in frequency applied to the pyroelectric thin film infrared sensor.

Referring to FIG. 9, it can be also found that where the lower Pt electrode 22 has a thickness of 300 Å, the voltage response is decreased from 21 μV to several microvolts, as the chopping frequency is increased from 1 Hz to 100 Hz.

As apparent from the above description, the lower Pt electrode is grown over the substrate to have (100)-oriented plane in accordance with the present invention, thereby enabling the pyroelectric thin film grown over the lower Pt electrode to exhibit an increased C-axis orientation. As a result, it is possible to increase the voltage response of the pyroelectric thin film infrared sensor finally fabricated. In accordance with the present invention, the C-axis orientation of the pyroelectric thin film can be repeatably controlled by adjusting the thickness of lower Pt thin film.

Since the pyroelectric thin film is grown directly over the lower Pt electrode, the fabrication of the pyroelectric thin film infrared sensor can be simplified.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pyroelectric thin film infrared sensor comprising:
   a substrate;
   a lower electrode disposed on a predetermined region of an upper surface of the substrate;
   a pyroelectric thin film disposed on a predetermined region of an upper surface of the lower electrode;
   an upper electrode disposed on a predetermined region of an upper surface of the pyroelectric thin film and adapted to absorb infrared rays;
   a lower electrode pad disposed on another predetermined region of the upper surface of the lower electrode; and
   wherein the lower electrode has a thickness of 150 to 400 Å.

2. A pyroelectric thin film infrared sensor in accordance with claim 1, wherein the pyroelectric thin film extends laterally to one side end of the lower electrode pad.

3. A pryoelectric thin film infrared sensor in accordance with claim 2, wherein the pyroelectric thin film is made of a ferroelectric material having a composition of $Pb_{1-x}La_xTiO_3$, where x is ranged from 0 to 0.15.

4. A pyroelectric thin film infrared sensor in accordance with claim 1, wherein the lower electrode is comprised of a Pt thin film having a (100)-oriented plane.

5. A pyroelectric thin film infrared sensor in accordance with claim 1, wherein the substrate comprises an MgO single crystal substrate having a (100)-oriented plane.

6. A pyroelectric thin film infrared sensor in accordance with claim 5, wherein the substrate has a membrane structure at a lower surface thereof.

7. A pyroelectric thin film infrared sensor in accordance with claim 1, wherein the substrate has a membrane structure at a lower surface thereof.

8. A pyroelectric thin film infrared sensor in accordance with claim 1, wherein the pyroelectric thin film is made of a ferroelectric material having a composition of $Pb_{1-x}La_xTiO_3$, where x is ranged from 0 to 0.15.

9. A pyroelectric thin film infrared sensor comprising:
   a substrate;
   a lower electrode disposed on a predetermined region of an upper surface of the substrate;
   a pyroelectric thin film disposed on a predetermined region of an upper surface of the lower electrode;
   an upper electrode disposed on a predetermined region of an upper surface of the pyroelectric thin film and adapted to absorb infrared rays; and
   wherein the substrate comprises a $SrTiO_3$ single crystal substrate having a (100)-oriented plane.

10. A pyroelectric thin film infrared sensor in accordance with claim 9, further comprising a lower electrode pad disposed on another predetermined region of the upper surface of the lower electrode.

11. A pyroelectric thin film infrared sensor in accordance with claim 10, wherein the pyroelectric thin film extends laterally to one side end of the lower electrode pad.

12. A pyroelectric thin film infrared sensor in accordance with claim 9, wherein the lower electrode has a thickness of 150 to 400 Å.

13. A method for fabricating a pyroelectric thin film infrared sensor, comprising the steps of:
   forming a lower electrode on a predetermined region of an upper surface of a substrate;
   forming a pyroelectric thin film on a predetermined region of an upper surface of the lower electrode;
   forming an upper electrode for absorption of infrared rays on a predetermined region of an upper surface of the pyroelectric thin film;
   forming a lower electrode pad on another predetermined region of the upper surface of the lower electrode; and
   wherein the lower electrode has a thickness of 150 to 400 Å.

* * * * *